US012688573B2

(12) United States Patent
Kim

(10) Patent No.: US 12,688,573 B2
(45) Date of Patent: Jul. 21, 2026

(54) SUBSTRATE INSPECTING UNIT AND SUBSTRATE TREATING APPARATUS INCLUDING THE SAME

(71) Applicant: SEMES CO., LTD., Chungcheongnam-do (KR)

(72) Inventor: Chul Woo Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 589 days.

(21) Appl. No.: 17/973,537

(22) Filed: Oct. 26, 2022

(65) Prior Publication Data

US 2023/0177676 A1 Jun. 8, 2023

(30) Foreign Application Priority Data

Dec. 2, 2021 (KR) ........................ 10-2021-0171256

(51) Int. Cl.
*H04N 7/01* (2006.01)
*G01N 21/88* (2006.01)
(Continued)

(52) U.S. Cl.
CPC ............. *G06T 7/001* (2013.01); *G01N 21/88* (2013.01); *G06T 2207/20212* (2013.01);
(Continued)

(58) Field of Classification Search
CPC ........... G06T 7/001; G06T 2207/20212; G06T 2207/30148; G01N 21/88; H01L 21/6715; H01L 21/67288
(Continued)

(56) References Cited

U.S. PATENT DOCUMENTS 10,099,497 B2 * 10/2018 Nagashima ................ B41J 2/01
10,180,623 B2 * 1/2019 Wakamatsu ........... B82Y 10/00
(Continued)

FOREIGN PATENT DOCUMENTS

CN 109976007 A * 7/2019 ....... G02F 1/133788
JP 2008-268330 11/2008
(Continued)

OTHER PUBLICATIONS

Office Action dated Oct. 30, 2023 for Korean Patent Application No. 10-2021-0171256 and its English machine translation by Google Translate.
(Continued)

*Primary Examiner* — Trang U Tran
(74) *Attorney, Agent, or Firm* — WOMBLE BOND DICKINSON (US) LLP

(57) ABSTRACT

Provided are a substrate inspecting unit capable of monitoring line defects or a bunch of spots formed on a substrate, and a substrate processing apparatus including the same. The substrate processing apparatus comprises a process processing unit for supporting a substrate; an inkjet head unit for discharging a droplet on the substrate while moving in a first direction and a second direction; a gantry unit for moving the inkjet head unit; and a substrate inspecting unit for inspecting the substrate in real time based on a plurality of droplets belonging to at least one row or column when the droplet is discharged onto the substrate and formed in the at least one row or column, wherein the substrate inspecting unit inspects a first defect related to a line caused by the plurality of droplets and/or a second defect related to an area caused by the plurality of droplets.

17 Claims, 10 Drawing Sheets

(51) Int. Cl.
  *G06T 7/00* (2017.01)
  *H10P 72/00* (2026.01)
(52) U.S. Cl.
  CPC ........................ *G06T 2207/30148* (2013.01);
    *H10P 72/0448* (2026.01); *H10P 72/0616*
    (2026.01)
(58) Field of Classification Search
  USPC ........................................................ 348/126
  See application file for complete search history.

(56) References Cited

U.S. PATENT DOCUMENTS

| | | | |
|---|---|---|---|
| 10,497,873 | B2 | 12/2019 | Lee et al. |
| 10,686,133 | B2 | 6/2020 | Lee et al. |
| 11,633,961 | B2 | 4/2023 | Collins et al. |
| 2010/0156976 | A1* | 6/2010 | Seo .......................... B41J 3/543 |
| | | | 347/14 |

FOREIGN PATENT DOCUMENTS

| | | |
|---|---|---|
| KR | 10-2011-0110275 | 10/2011 |
| KR | 10-2013-0124823 | 11/2013 |
| KR | 10-2016-0065581 | 6/2016 |
| KR | 10-2019-0038724 | 4/2019 |
| KR | 10-2021-0041175 | 4/2021 |
| KR | 10-2021-0085106 | 7/2021 |
| KR | 10-2021-0093328 | 7/2021 |

OTHER PUBLICATIONS

Notice of Allowance dated Jan. 24, 2025 for Korean Patent Application No. 10-2021-0171256 and its English translation by Google Translate.

* cited by examiner

SUBSTRATE INSPECTING UNIT AND SUBSTRATE TREATING APPARATUS INCLUDING THE SAME

This application claims the benefit of Korean Patent Application No. 10-2021-0171256, filed on Dec. 2, 2021, in the Korean Intellectual Property Office, the disclosure of which is incorporated herein by reference in its entirety.

BACKGROUND

1. Field

The present invention relates to an apparatus for processing a substrate and a substrate inspecting unit included therein. More particularly, it relates to an apparatus for processing a substrate by discharging droplets onto a substrate, and a substrate inspecting unit included therein.

2. Description of the Related Art

When performing a printing process (e.g., RGB patterning) on a transparent substrate to manufacture a display device such as an LCD panel, PDP panel, LED panel, etc., a printing equipment having an inkjet head unit may be used.

SUMMARY

When pixel printing is performed on a substrate using the inkjet head unit, a plurality of nozzles installed in the inkjet head unit may be used to jet droplets to a predetermined position on the substrate.

However, in the case of discharging droplets using a nozzle, a problem of an impact error of the nozzle frequently occurs, which causes a problem in that a line defect is formed on the substrate. In addition, due to jetting abnormalities of the nozzles, a bundle of spots may be formed in various parts of the substrate.

The object of the present invention is to provide a substrate inspecting unit capable of monitoring line defects or a bundle of spots formed on a substrate when pixel printing is performed on a substrate, and a substrate processing apparatus including the same.

The objects of the present invention are not limited to the objects mentioned above, and other objects not mentioned will be clearly understood by those skilled in the art from the following description.

One aspect of the substrate processing apparatus of the present invention for achieving the above object comprises a process processing unit for supporting a substrate; an inkjet head unit for discharging a droplet on the substrate while moving in a first direction and a second direction; a gantry unit for moving the inkjet head unit; and a substrate inspecting unit for inspecting the substrate in real time based on a plurality of droplets belonging to at least one row or column when the droplet is discharged onto the substrate and formed in the at least one row or column, wherein the substrate inspecting unit inspects a first defect related to a line caused by the plurality of droplets and/or a second defect related to an area caused by the plurality of droplets.

Wherein the substrate inspecting unit inspects the first defect and/or the second defect based on an image related to the plurality of droplets.

Wherein the substrate inspecting unit processes an image related to the plurality of droplets based on a grey scale, and then inspects the first defect and/or the second defect based on the processed image.

Wherein the substrate inspecting unit inspects the first defect and/or the second defect based on an image obtained according to a swath operation of the inkjet head unit.

Wherein the substrate inspecting unit combines a plurality of partial images obtained according to a swath operation of the inkjet head unit, and then inspects the first defect and/or the second defect based on the combined image, or inspects the first defect and/or the second defect based on each partial image.

Wherein, when inspecting the first defect, the substrate inspecting unit inspects the first defect based on whether a plurality of droplets belonging to one row or column are located on the same line.

Wherein, when inspecting the second defect, the substrate inspecting unit inspects the second defect based on whether a plurality of droplets belonging to at least one row maintain the same distance, or inspects the second defect based on whether a plurality of droplets belonging to at least one column maintain the same distance. Wherein a distance between two different droplets belonging to one row is different from a distance between two different droplets belonging to one column.

Wherein, when inspecting the second defect, the substrate inspecting unit inspects the second defect based on whether a plurality of droplets belonging to at least one row and at least one column maintain the same distance. Wherein a distance between two different droplets belonging to one row is the same as a distance between two different droplets belonging to one column.

The substrate inspecting apparatus further comprises a camera module for obtaining an image related to the plurality of droplets, wherein the substrate inspecting unit inspects the first defect and/or the second defect based on an image obtained by a camera module.

Wherein the camera module is installed in the gantry unit.

Wherein the camera module is disposed behind the inkjet head unit or disposed in parallel with the inkjet head unit along a longitudinal direction of the gantry unit.

Wherein the camera module includes a line scan camera and an area scan camera.

Wherein the substrate inspecting unit inspects the first defect based on an image obtained using the line scan camera, and inspects the second defect based on an image obtained using the area scan camera.

Another aspect of the substrate processing apparatus of the present invention for achieving the above object comprises a process processing unit for supporting a substrate; an inkjet head unit for discharging a droplet on the substrate while moving in a first direction and a second direction; a gantry unit for moving the inkjet head unit; and a substrate inspecting unit for inspecting the substrate in real time based on a plurality of droplets belonging to at least one row or column when the droplet is discharged onto the substrate and formed in the at least one row or column, wherein the substrate inspecting unit inspects a first defect related to a line caused by the plurality of droplets and/or a second defect related to an area caused by the plurality of droplets based on an image related to the plurality of droplets and obtained according to a swath operation of the inkjet head unit, wherein the substrate inspecting unit processes the image related to the plurality of droplets based on a grey scale, and then inspects the first defect and/or the second defect based on the processed image, wherein, when inspecting the first defect, the substrate inspecting unit inspects the first defect based on whether a plurality of droplets belonging to one row or column are located on the same line;

wherein, when inspecting the second defect, the substrate inspecting unit inspects the second defect based on whether a plurality of droplets belonging to at least one row and/or a plurality of droplets belonging to at least one column maintain the same distance.

One aspect of the substrate inspecting unit of the present invention for achieving the above object is provided in a substrate processing apparatus for processing the substrate by discharging a droplet on a substrate using an inkjet head unit, wherein, when the droplet is discharged onto the substrate and formed in at least one row or column, the substrate inspecting unit inspects the substrate in real time based on a plurality of droplets belonging to the at least one row or column, wherein the substrate inspecting unit inspects a first defect related to a line caused by the plurality of droplets and/or a second defect related to an area caused by the plurality of droplets based on an image related to the plurality of droplets.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
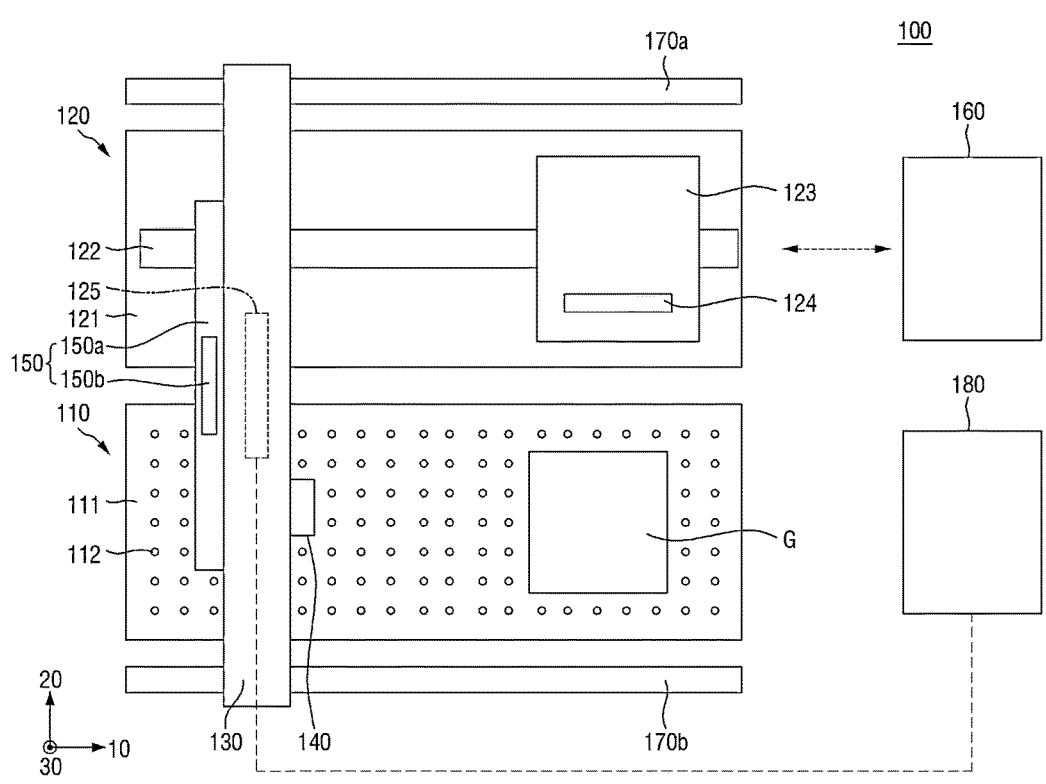
FIG. 1 is a diagram schematically illustrating an overall structure of a substrate processing apparatus according to an embodiment of the present invention.

Hereinafter, embodiments of the present invention will be described in detail with reference to the accompanying drawings. The same reference numerals are used for the same components in the drawings, and duplicate descriptions thereof are omitted.

The present invention relates to a substrate processing apparatus for performing pixel printing on a substrate using an inkjet head unit. The substrate processing apparatus may include a control unit, characterized in that the control unit is capable of monitoring line defects or a bunch of spots formed on the substrate when pixel printing is performed on the substrate. Hereinafter, a substrate processing apparatus and a control unit included therein will be described in detail with reference to the drawings.

FIG. 1 is a diagram schematically illustrating an overall structure of a substrate processing apparatus according to an embodiment of the present invention.

The substrate processing apparatus 100 processes a substrate G (e.g., a glass substrate) used for manufacturing a display device. The substrate processing apparatus 100 may be provided as an inkjet facility for printing the substrate G by jetting the substrate processing liquid onto the substrate G using the inkjet head unit 140.

The substrate processing apparatus 100 may use ink as a substrate processing liquid. In this case, the ink may be a quantum dot (QD) ink, and the substrate processing apparatus 100 may be provided with, for example, a QD (Quantum Dot) CF (Color Filter) inkjet facility. The substrate processing apparatus 100 may perform pixel printing on the substrate G using the substrate processing liquid, and may be provided as a circulating inkjet facility to prevent the nozzles from being clogged by the substrate processing liquid.

As shown in FIG. 1, the substrate processing apparatus 100 may include a process processing unit 110, a maintenance unit 120, a gantry unit 130, an inkjet head unit 140, a substrate processing liquid supply unit 150, the control unit (controller) 160, and a substrate inspecting unit 180.

The process processing unit 110 supports the substrate G while the PT operation is performed on the substrate G. The process processing unit 110 may support the substrate G using a non-contact method. The process processing unit 110 may support the substrate G by levitating the substrate G in the air using, for example, air. However, the present embodiment is not limited thereto. The process processing unit 110 may support the substrate G using a contact method. The process processing unit 110 may support the substrate G using, for example, a support member having a seating surface provided thereon.

Meanwhile, in the above, the PT operation refers to printing the substrate G using the substrate processing liquid, and the substrate processing liquid refers to a chemical liquid used to print the substrate G. The substrate processing liquid may be, for example, quantum dot ink including ultrafine semiconductor particles.

The process processing unit 110 may move the substrate G in a state, in which the substrate G is supported by using air. The process processing unit 110 may be configured to include, for example, a first stage 111 and an air hole 112.

The first stage 111 serves as a base, and is provided so that the substrate G can be seated thereon. The air holes 112 may be formed passing through the upper surface of the first stage 111, and a plurality of air holes 112 may be formed in a printing zone on the first stage 111.

The air hole 112 may inject air in the upper direction (the third direction 30) of the first stage 111. The air hole 112 may levitate the substrate G seated on the first stage 111 in the air through the air hole 112.

Although not shown in FIG. 1, the process processing unit 110 may further include a gripper and a guide rail. When the substrate G moves along the longitudinal direction (the first direction 10) of the first stage 111, the gripper grips the substrate G to prevent the substrate G from being separated from the first stage 111. When the substrate G moves, the gripper may move in the same direction as the substrate G along the guide rail while gripping the substrate G. The gripper and the guide rail may be provided outside the first stage 111.

The maintenance unit 120 measures a discharge position (i.e., impact point) of the substrate processing liquid on the substrate G, whether the substrate processing liquid is discharged, and the like. The maintenance unit 120 may measure the discharge position of the substrate processing liquid, whether the substrate processing liquid is discharged, etc. with respect to each of the plurality of nozzles provided in the inkjet head unit 140, and provide the obtained measurement result to the control unit 160.

The maintenance unit 120 may comprise, for example, a second stage 121, a third guide rail 122, a first plate 123, a calibration board 124 and a camera module 125.

Like the first stage 111, the second stage 121 serves as a base and may be disposed in parallel with the first stage 111. The second stage 121 may be provided to have the same size as the first stage 111, but may be provided to have a size smaller or larger than that of the first stage 111. The second stage 121 may include a maintenance zone thereon.

The third guide rail 122 guides the movement path of the first plate 123. The third guide rail 122 may be provided on the second stage 121 as at least one line along the longitudinal direction of the second stage 121 (the first direction 10). The third guide rail 122 may be provided as, for example, an LM guide system (Linear Motor guide system).

Although not shown in FIG. 1, the maintenance unit 120 may further include a fourth guide rail. Like the third guide rail 122, the fourth guide rail guides the movement path of the first plate 123, and is provided on the second stage 121 as at least one line along the width direction (the second direction 20) of the second stage 121. The fourth guide rail may also be provided as an LM guide system, like the third guide rail 122.

The first plate 123 moves on the second stage 121 along the third guide rail 122 and/or the fourth guide rail. The first plate 123 may move in parallel with the substrate G along the third guide rail 122, and may approach or move away from the substrate G along the fourth guide rail.

The calibration board 124 is for measuring the discharge position of the substrate processing liquid on the substrate G. The calibration board 124 may be installed on the first plate 123 including an alignment mark, a ruler, and the like, and may be provided along the longitudinal direction of the first plate 123 (first direction 10).

The camera module 125 obtains image information about the substrate G in order to measure the discharge position of the substrate processing liquid, whether the substrate processing liquid is discharged, and the like. A more detailed description of the camera module 125 will be described later.

The gantry unit 130 supports the inkjet head unit 140. The gantry unit 130 may be provided on the first stage 111 and the second stage 121 so that the inkjet head unit 140 can discharge the substrate processing liquid onto the substrate G.

The gantry unit 130 may be provided on the first stage 111 and the second stage 121 with the width direction (the second direction 20) of the first stage 111 and the second stage 121 as the longitudinal direction. The gantry unit 130 may move in a longitudinal direction (first direction (10)) of the first stage 111 and the second stage 121 along the first guide rail 170a and the second guide rail 170b. Meanwhile, the first guide rail 170a and the second guide rail 170b may be provided outside the first stage 111 and the second stage 121 along the longitudinal direction (the first direction 10) of the first stage 111 and the second stage 121.

Meanwhile, although not shown in FIG. 1, the substrate processing apparatus 100 may further include a gantry moving unit. The gantry moving unit moves the gantry unit 130 along the first guide rail 170a and the second guide rail 170b. The gantry moving unit may be installed inside the gantry unit 130 and may include a first moving module (not shown) and a second moving module (not shown). The first moving module and the second moving module may be provided at both ends within the gantry unit 130, and may slidingly move the gantry unit 130 along the first guide rail 170a and the second guide rail 170b.

The inkjet head unit 140 discharges the substrate processing liquid on the substrate G in the form of droplets. The inkjet head unit 140 may be provided at the side or below the gantry unit 130.

At least one inkjet head unit 140 may be installed in the gantry unit 130. When a plurality of inkjet head units 140 are installed in the gantry unit 130, the plurality of inkjet head units 140 may be arranged in a line along the longitudinal direction (the second direction 20) of the gantry unit 130.

The inkjet head unit 140 may move along the longitudinal direction (the second direction 20) of the gantry unit 130 to be located at a desired point on the substrate G. However, the present embodiment is not limited thereto. The inkjet head unit 140 may move along the height direction (the third direction 30) of the gantry unit 130, and may also rotate clockwise or counterclockwise.

Meanwhile, the inkjet head unit 140 may be installed to be fixed to the gantry unit 130. In this case, the gantry unit 130 may be provided to be movable.

Meanwhile, although not shown in FIG. 1, the substrate processing apparatus 100 may further include an inkjet head moving unit. The inkjet head moving unit linearly moves or rotates the inkjet head unit 140. When the substrate processing apparatus 100 is configured to include a plurality of inkjet head units 140, the inkjet head moving unit may be provided in the substrate processing apparatus 100 corresponding to the number of inkjet head units 140 to independently operate the plurality of inkjet head units 140. Meanwhile, a single inkjet head moving unit may be provided in the substrate processing apparatus 100 to uniformly operate the plurality of inkjet head units 140.

Meanwhile, although not shown in FIG. 1, the inkjet head unit 140 may include a nozzle plate, a plurality of nozzles, a piezoelectric element, and the like. The nozzle plate constitutes the body of the inkjet head unit 140. A plurality of (e.g., 128, 256, etc.) nozzles may be provided in multiple rows and columns at regular intervals under the nozzle plate, and the piezoelectric element may be provided as many as the number corresponding to the number of nozzles in the nozzle plate. When the inkjet head unit 140 is configured as described above, the substrate processing liquid may be discharged onto the substrate G through the nozzle according to the operation of the piezoelectric element.

Meanwhile, the inkjet head unit 140 may independently control the discharge amount of the substrate processing liquid provided through each nozzle according to a voltage applied to the piezoelectric element.

The substrate processing liquid supply unit 150 supplies ink to the inkjet head unit 140. The substrate processing liquid supply unit 150 may include a storage tank 150*a* and a pressure control module 150*b*.

The storage tank 150*a* stores the substrate processing liquid, and the pressure control module 150*b* controls the internal pressure of the storage tank 150*a*. The storage tank 150*a* may supply an appropriate amount of the substrate processing liquid to the inkjet head unit 140 based on the pressure provided by the pressure control module 150*b*.

The control unit 160 controls the overall operation of each unit constituting the substrate processing apparatus 100. The control unit 160 may control the operation of, for example, the air hole 112 and the gripper of the process processing unit 110, the camera module 125 of the maintenance unit 120, the gantry unit 130, the inkjet head unit 140, the pressure control module 150*b* of the substrate processing liquid supply unit 150.

The control unit 160 may be implemented by a computer or a server, including a process controller, a control program, an input module, an output module (or a display module), a memory module, and the like. In the above, the process controller may include a microprocessor that executes a control function for each component constituting the substrate processing apparatus 100, and the control program may execute various processing of the substrate processing apparatus 100 according to the control of the process controller. The memory module stores programs for executing various processing of the substrate processing apparatus 100 according to various data and processing conditions, i.e., processing recipes.

Meanwhile, the control unit 160 may also serve to perform maintenance on the inkjet head unit 140. The control unit 160, for example, may correct the discharge position of the substrate processing liquid of each nozzle provided in the inkjet head unit 140 based on the measurement result of the maintenance unit 120, or detect a defective nozzle (that is, a nozzle that does not discharge the substrate processing liquid) among a plurality of nozzles and perform a cleaning operation on the defective nozzle.

As described above, an impact error problem frequently occurs with respect to the nozzle of the inkjet head unit 140, and as a result, a problem in that the substrate G is deteriorated due to a line defect formed on the substrate G occurs. In addition, a bundle of spots is formed on the substrate G due to jetting abnormality of the nozzle, which causes a problem, in which the substrate G is defective.

In the present invention, in order to solve this problem, when the substrate G is processed, it can be monitored whether a line defect problem or a spot problem occurs on the substrate G by using the camera module 125 and the control unit 160. That is, in the present invention, by building a system that monitors in real time a problem of line defects due to an impact error or a problem of spots due to jetting abnormality, the quality defect of the substrate G can be minimized, and it is possible to obtain the effect of preventing wastage in terms of time or cost by preventing a large number of process defects from occurring.

Hereinafter, this will be described in detail. First, the camera module 125 and the control unit 160 will be described.

As described above, the camera module 125 is to obtain image information on the substrate G. The image information of the substrate G obtained by the camera module 125 may include information on whether or not the substrate processing liquid is discharged, the discharge position of the substrate processing liquid, the discharge amount of the substrate processing liquid, the discharge area of the substrate processing liquid, etc.

When processing the substrate G, the camera module 125 may obtain image information on the substrate G in real time. The camera module 125 may obtain image information by photographing the substrate G in the longitudinal direction (the first direction 10). In this case, the camera module 125 may include a line scan camera. Also, the camera module 125 may obtain image information by photographing the substrate G for each region of a predetermined size. In this case, the camera module 125 may include an area scan camera.

As described above, in the present embodiment, it is possible to monitor in real time a problem of a line defect caused by an impact error or a problem of a spot caused by a jetting abnormality. For this purpose, when the nozzle of the inkjet head unit 140 discharges the substrate processing liquid onto the substrate G, the camera module 125 immediately captures the corresponding region on the substrate G to obtain image information on the substrate G. Alternatively, the camera module 125 may capture the entire surface of the substrate G to obtain image information on the substrate G whenever the nozzle of the inkjet head unit 140 discharges the substrate processing liquid to at least a portion of the substrate G.

The camera module 125 may be disposed in the rearward of the inkjet head unit 140 for the real-time monitoring. Here, the rearward disposal means that it is disposed to follow the inkjet head unit 140 in consideration of the moving direction of the inkjet head unit 140.

Figure 2:
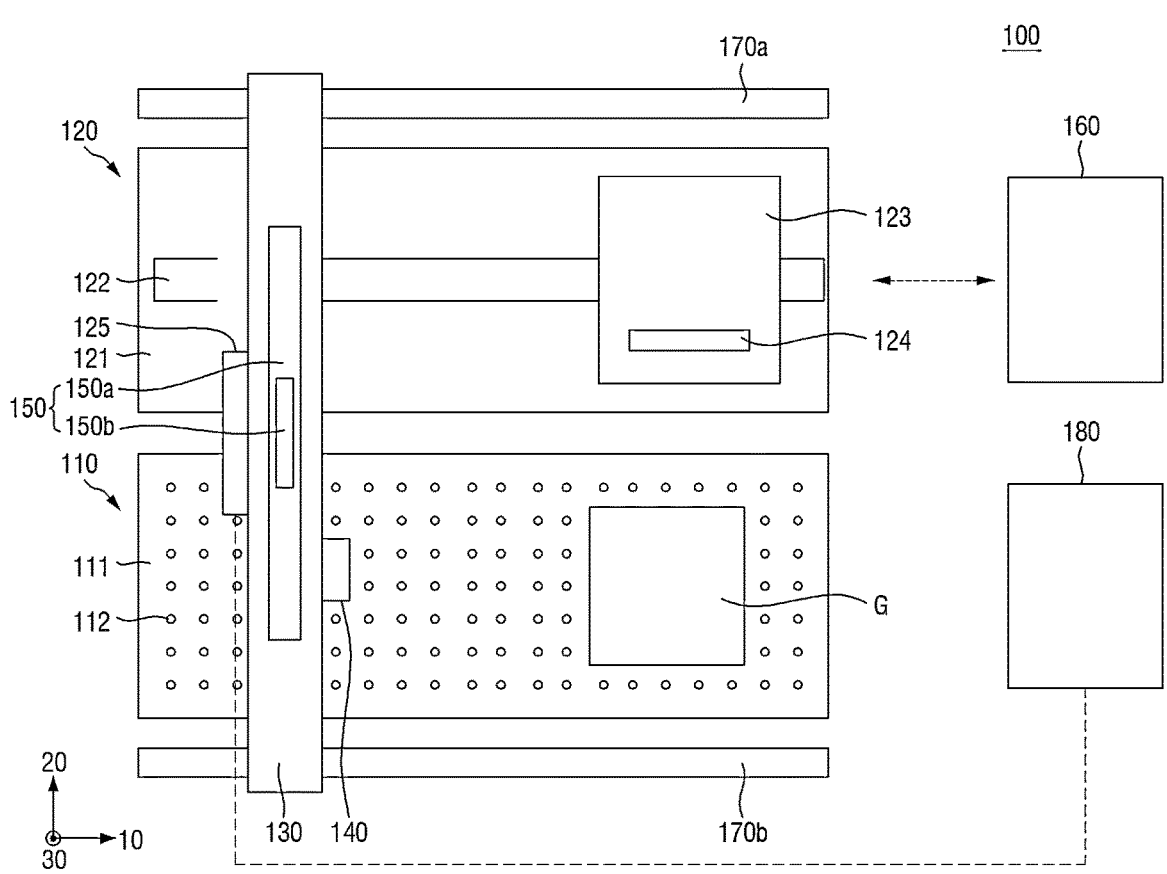
FIG. 2 is a diagram schematically illustrating an overall structure of a substrate processing apparatus according to another embodiment of the present invention.

The camera module 125 may be attached to the bottom surface of the gantry unit 130 when the inkjet head unit 140 is attached to the side surface of the gantry unit 130. However, the present embodiment is not limited thereto. As shown in FIG. 2, the inkjet head unit 140 may be attached to the first side surface of the gantry unit 130, and the camera module 125 may be attached to the second side surface of the gantry unit 130. In this case, in consideration of the moving direction of the gantry unit 130, the first side of the gantry unit 130, in which the inkjet head unit 140 is installed, is disposed in the front, and the second side of the gantry unit 130, in which the camera module 125 is installed, is disposed in the rear. FIG. 2 is a diagram schematically illustrating an overall structure of a substrate processing apparatus according to another embodiment of the present invention.

Meanwhile, in the above case, the substrate processing liquid supply unit 150 may be installed on the gantry unit 130, but may also be installed on the second side surface of the gantry unit 130 together with the camera module 125.

Meanwhile, in the present embodiment, the inkjet head unit 140 may be attached to the bottom surface of the gantry unit 130, and the camera module 125 may be attached to the side surface of the gantry unit 130. Likewise in this case, the inkjet head unit 140 is disposed in front of the camera module 125 in consideration of the moving direction of the gantry unit 130. In addition, in the above case, the substrate processing liquid supply unit 150 may be installed on the second side surface of the gantry unit 130 together with the camera module 125, or may be installed alone on the first side surface of the gantry unit 130.

Meanwhile, in the present embodiment, the camera module 125 may be disposed in the front, and the inkjet head unit 140 may be disposed in the rear thereof. When the inkjet head unit 140 is disposed in the front and the camera module 125 is disposed in the rear thereof, the camera module 125 follows the inkjet head unit 140 to obtain image information of the substrate G by capturing the corresponding position on the substrate G, to which the droplets are discharged. Therefore, in this case, the camera module 125 may be fixedly installed.

However, when the camera module 125 is disposed in front of the inkjet head unit 140, image information of the substrate G cannot be obtained by the above method. Therefore, in this case, when a droplet is discharged on the substrate G by the nozzle of the inkjet head unit 140, the camera module 125 rotates based on information about the corresponding position on the substrate G, to which the droplet is discharged, to obtain image information of the substrate G. In the case of information on a corresponding position on the substrate G, to which the droplet is discharged, the camera module 125 may receive the information from the control unit 160.

Meanwhile, the camera module 125 may be disposed in parallel with the inkjet head unit 140. Here, the parallel disposal means that the camera module 125 is disposed adjacent to the side surface of the inkjet head unit 140 in the second direction 20.

The substrate inspecting unit 180 serves to process and analyze image information of the substrate G obtained by the camera module 125. The substrate inspecting unit 180 may interwork with the camera module 125 for this purpose, and may be provided with a computer or server, including a process controller, a control program, an input module, an output module (or a display module), a memory module, etc.

The substrate inspecting unit 180 may inspect a line defect problem due to an impact error based on image information of the substrate G, and may inspect a spot problem due to jetting abnormality. Hereinafter, this will be described.

Figure 3:
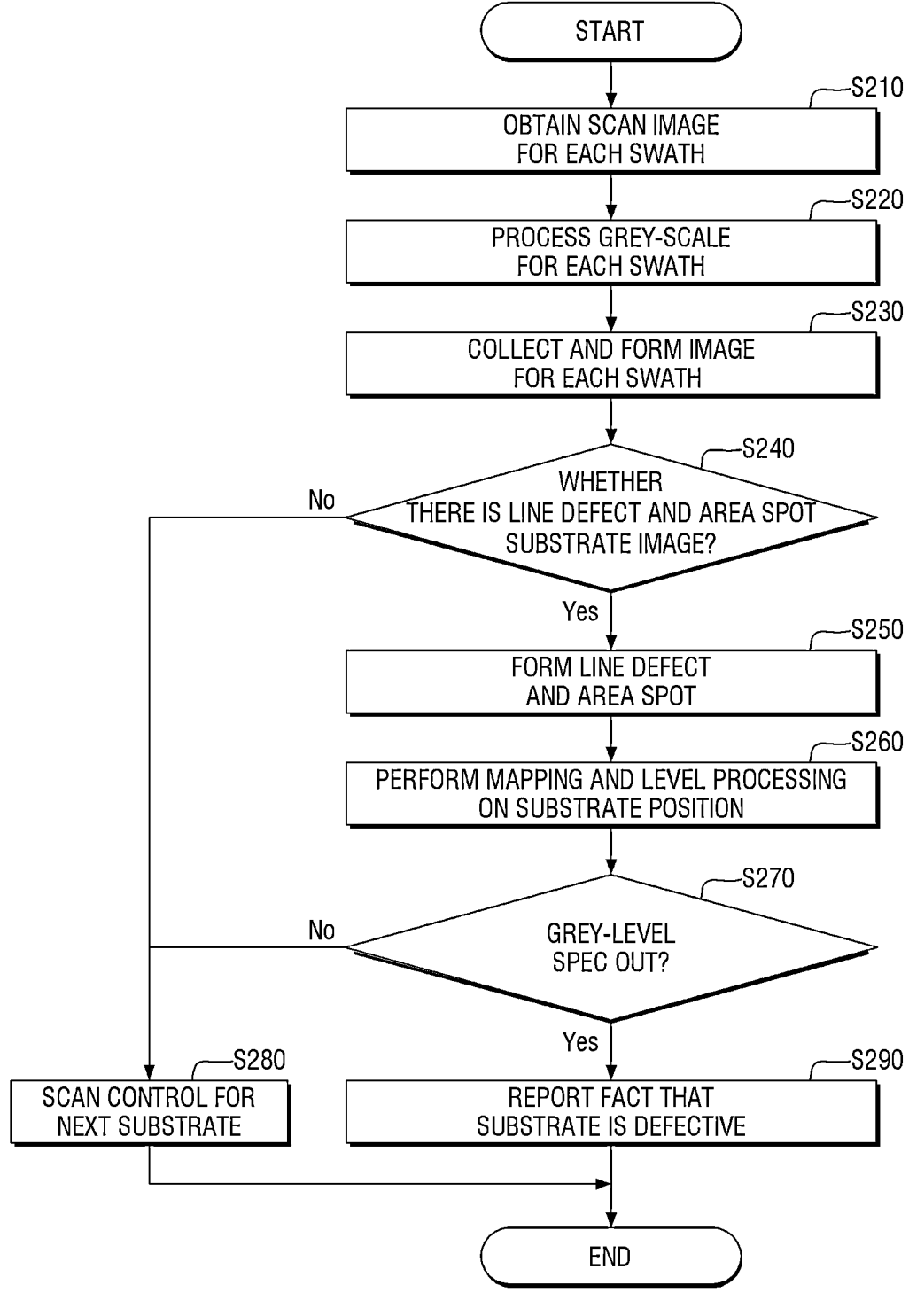
FIG. 3 is a flowchart illustrating an image processing and analysis method of a substrate inspecting unit constituting a substrate processing apparatus according to an embodiment of the present invention.

FIG. 3 is a flowchart illustrating an image processing and analysis method of a substrate inspecting unit constituting a substrate processing apparatus according to an embodiment of the present invention. The following description refers to FIG. 3.

When the camera module 125 obtains image information of the substrate G, the substrate inspecting unit 180 interworking with the camera module 125 may obtain image information of the substrate G from the camera module 125 (S210).

The image information of the substrate G obtained by the substrate inspecting unit 180 from the camera module 125 is an image after the nozzle of the inkjet head unit 140 discharges droplets onto the substrate G. The camera module 125 may obtain the image information by scanning the upper surface of the substrate G after one printing swath operation of the inkjet head unit 140. That is, the image information of the substrate G obtained by the camera module 125 is a scan image for each swath, and may be an image of a partial region of the substrate G.

Figure 4:
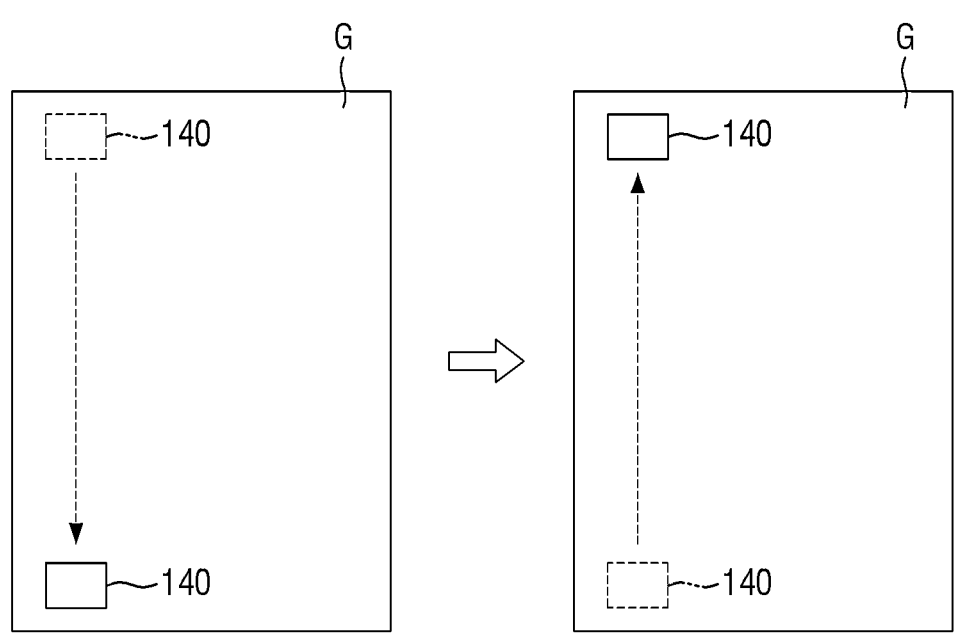
FIG. 4 is an exemplary diagram for supplementary description of each step of the image processing and analysis method of the substrate inspecting unit according to an embodiment of the present invention.

In the above, one printing swath operation, as shown in FIG. 4, means that the inkjet head unit 140 discharges droplets on the substrate G while going from one end of the substrate G to the other end of the substrate G. That is, the inkjet head unit 140 reciprocates one end and the other end of the substrate G while discharging droplets on the substrate G. One reciprocation is one printing swath operation. Since the printing swath operation proceeds while moving in the width direction of the substrate G, the number of repetitions of the printing swath operation may vary depending on the size of the substrate G in the width direction, but the printing swath operation may be usually repeated 30 to 50 times in order to complete the printing operation on the substrate G. FIG. 4 is an exemplary diagram for supplementary description of each step of the image processing and analysis method of the substrate inspecting unit according to an embodiment of the present invention.

It will be described again with reference to FIG. 3.

When the image information of the substrate G is obtained from the camera module 125, the substrate inspecting unit 180 processes the image information (S220). The substrate inspecting unit 180 may process image information of the substrate G in a grey scale.

The substrate inspecting unit 180 may process the partial region image whenever a scan image for each swath, that is, a partial region image of the substrate G is obtained by the camera module 125. Since the printing swath operation may be repeated a plurality of times (e.g., 30 to 50 times) as described above, the substrate inspecting unit 180 may process the plurality of partial region images of substrates G by an image processing operation.

When the image of each partial region of the substrate G is processed, the substrate inspecting unit 180 combines each partial region image of the substrate G to form an image of the entire region of the substrate G (S230). Since the printing swath operation discharges droplets on the substrate G while moving in the width direction of the substrate G, the substrate inspecting unit 180 may form an image for the entire region of the substrate G by arranging each partial region image of the substrate G in the width direction and then combining them.

Thereafter, the substrate inspecting unit 180 determines whether there are a portion corresponding to a line defect and a portion corresponding to an area spot in the image of the entire region of the substrate G (S240).

If it is determined that there is no portion corresponding to the line defect and no portion corresponding to the area spot in the image for the entire region of the substrate G, the substrate inspecting unit 180 controls to allow the camera module 125 to scan the next substrate (S280).

On the other hand, if it is determined that there is a portion corresponding to a line defect and a portion corresponding to an area spot in the image for the entire region of the substrate G, the substrate inspecting unit 180 forms the line defect and the area spot from the image for the entire region of the substrate G (S250). Subsequently, the substrate inspecting unit 180 performs mapping and level processing on the position of the formed portion in the image for the entire region of the substrate G (S260). That is, the substrate inspecting unit 180 may detect a partial image corresponding to a line defect and a partial image corresponding to an area spot from the image for the entire region of the substrate G through steps S250 and S260.

When a partial image corresponding to a line defect and a partial image corresponding to an area spot are detected in the image for the entire region of the substrate G, the substrate inspecting unit 180 compares the detected partial image with a reference image to determine whether the detected partial image matches the reference image (S270). Here, that the detected partial image matches the reference image means that the detected partial image is the same as the reference image or even if there is an error between the detected partial image and the reference image, the error does not deviate from the reference range.

In the above, if it is determined that the detected partial image matches the reference image, the substrate inspecting unit 180 controls the camera module 125 to scan the next substrate (S280).

On the other hand, if it is determined that the detected partial image does not match the reference image, the substrate inspecting unit 180 reports the fact that the substrate G is defective to the manager so that the processing of the next substrate is not performed (S290).

Meanwhile, in the present embodiment, the substrate inspecting unit 180 may perform an image processing and analysis method on an image for each partial region of the substrate G instead of an image for the entire region of the substrate G. In this case, the substrate inspecting unit 180 may not form an image for the entire region of the substrate G by combining the images for each partial region of the substrate G. That is, in the image processing and analysis method of the substrate inspecting unit 180, step S230 may be omitted, and step S240 may be subsequently performed after step S220.

On the other hand, in the present embodiment, the substrate inspecting unit 180 does not determine both whether there is a portion corresponding to the line defect and whether there is a portion corresponding to the area spot in the image of the substrate G, but may determine only one of whether there is a portion corresponding to the line defect and whether there is a portion corresponding to the area spot.

On the other hand, in the present embodiment, the substrate inspecting unit 180 does not determine whether there is a portion corresponding to a line defect and a portion corresponding to an area spot in the image for the entire region of the substrate G, and may determine whether there is a portion corresponding to a line defect in the image for each partial region of the substrate G, and may determine whether there is a portion corresponding to an area spot in the image for the entire region of the substrate G.

Next, a description will be given of a method, in which the substrate inspecting unit 180 determines whether there is a portion corresponding to a line defect and whether there is a portion corresponding to an area spot in the image of the substrate G.

First, a method of determining whether there is a portion corresponding to a line defect in the image of the substrate G will be described.

When pixel printing is performed on the substrate G, the inkjet head unit 140 discharges droplets at predetermined positions on the substrate G while moving along the longitudinal direction (first direction 10) of the substrate G. And thereafter, the inkjet head unit 140 moves a predetermined distance in the width direction (the second direction 20) of the substrate G, and then discharges a droplet at each predetermined position while moving along the longitudinal direction 10 of the substrate G again. By repeating this process several times, the inkjet head unit 140 finally discharges droplets on the entire surface of the substrate G.

Figure 5:
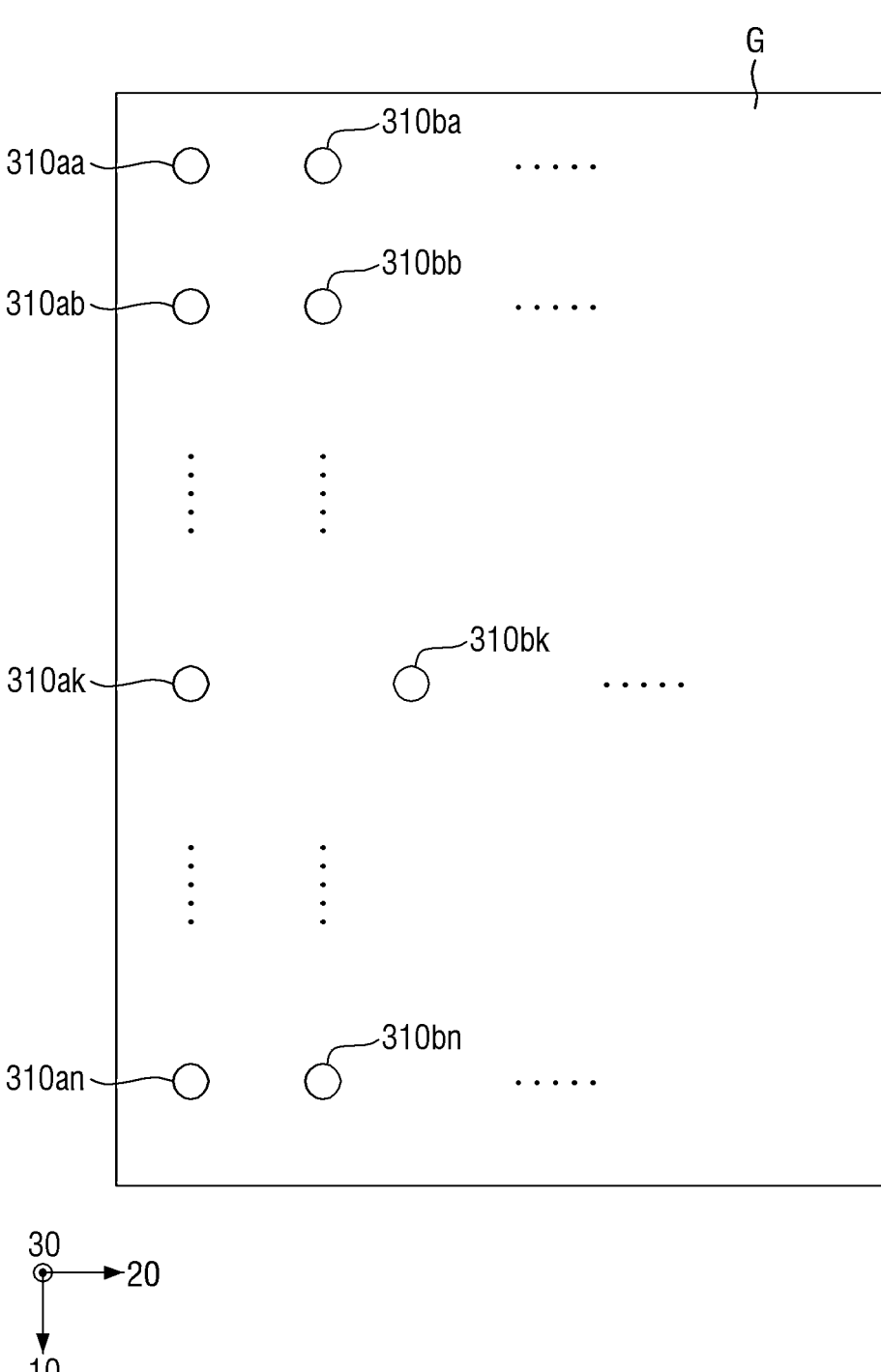
FIG. 5 is a first exemplary view for describing a method for determining a line defect of a substrate inspecting unit according to an embodiment of the present invention.

With respect to the substrate G processed as described above, as shown in FIG. 5, a plurality of droplets 310aa, 310ab, . . . , 310an formed in a first column along the longitudinal direction 10 of the substrate G are defined as a first group, and a plurality of droplets 310ba, 310bb, . . . , 310bn formed in a second column are defined as a second group. FIG. 5 is a first exemplary view for describing a method for determining a line defect of a substrate inspecting unit according to an embodiment of the present invention.

According to FIG. 5, the plurality of droplets 310aa, 310ab, . . . , 310an belonging to the first group are all located on the same line. Accordingly, in this case, the substrate inspecting unit 180 may determine that there is no line defect with respect to the plurality of droplets 310aa, 310ab, . . . , 310an belonging to the first group.

On the other hand, the plurality of droplets 310ba, 310bb, . . . , 310bn belonging to the second group are not all located on the same line. Accordingly, in this case, the substrate inspecting unit 180 may determine that the plurality of droplets 310ba, 310bb, . . . , 310bn belonging to the second group have a line defect.

Meanwhile, in the above case, the substrate inspecting unit 180 may determine that a defect has occurred in the nozzle that discharges the kth droplet 310bk among the plurality of nozzles of the inkjet head unit 140 since the kth droplet 310bk among the plurality of droplets 310ba, 310bb, . . . , 310bn belonging to the second group is on a line different from that of the other droplets.

Figure 6:
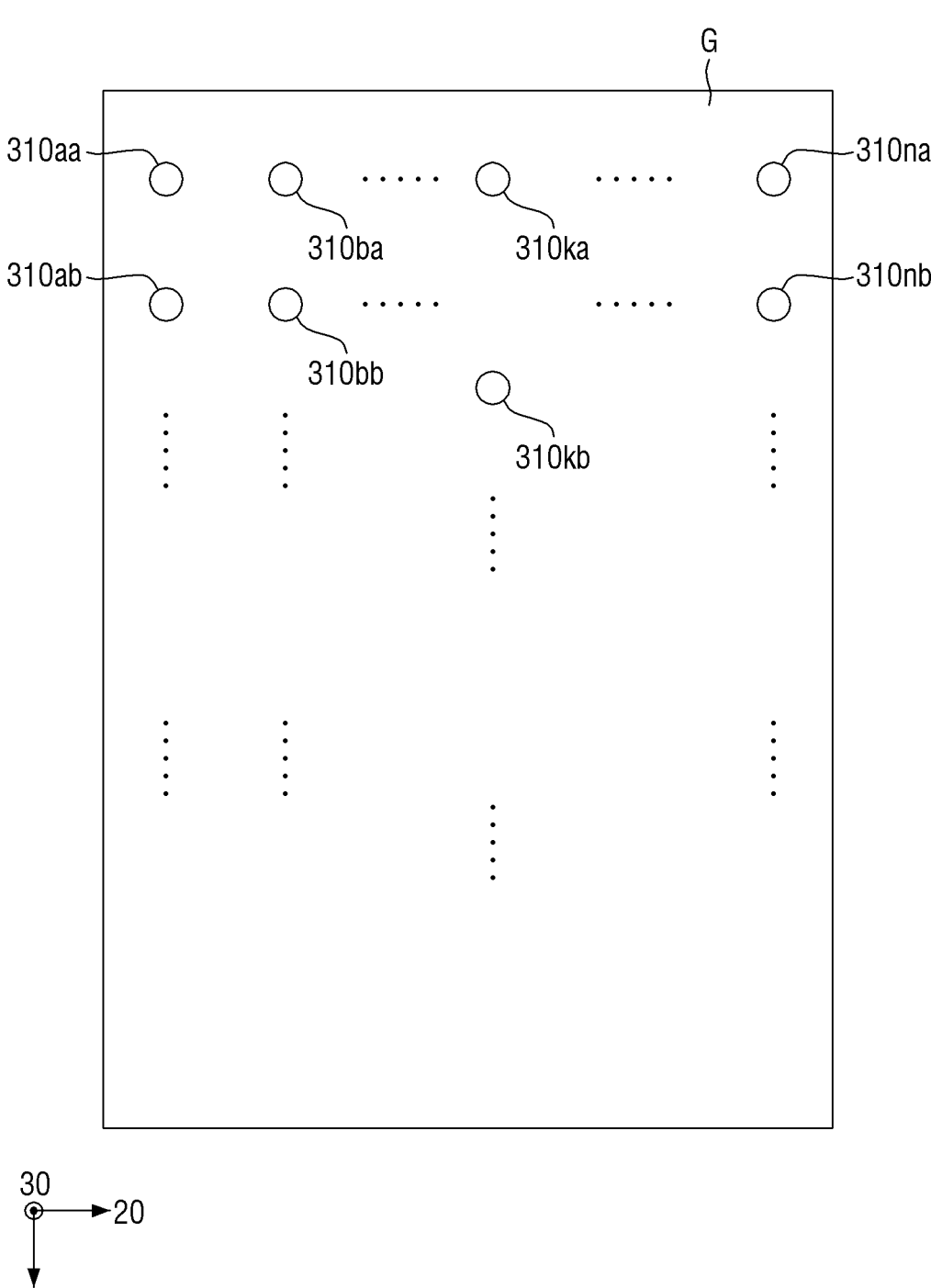
FIG. 6 is a second exemplary view for describing a method for determining a line defect of a substrate inspecting unit according to an embodiment of the present invention.

Similarly, as shown in FIG. 6, a plurality of droplets 310aa, 310ba, . . . , 310na formed in a first row along the width direction 20 of the substrate G are defined as a third group, and a plurality of droplets 310ab, 310bb, . . . , 310nb formed in a second rows are defined as a fourth group. FIG. 6 is a second exemplary view for describing a method for determining a line defect of a substrate inspecting unit according to an embodiment of the present invention.

Referring to FIG. 6, the plurality of droplets 310aa, 310ba, . . . , 310na belonging to the third group are all located on the same line. Accordingly, in this case, the substrate inspecting unit 180 may determine that there is no line defect with respect to the plurality of droplets 310aa, 310ba, . . . , 310na belonging to the third group.

On the other hand, the plurality of droplets 310ab, 310bb, . . . , 310nb belonging to the fourth group are not all located on the same line. Accordingly, in this case, the substrate inspecting unit 180 may determine that the plurality of droplets 310ab, 310bb, . . . , 310nb belonging to the fourth group have a line defect.

Meanwhile, in the above case, since the k' droplet 310kb among the plurality of droplets 310ab, 310bb, . . . , 310nb belonging to the fourth group is located on a different line from the other droplets, the substrate inspecting unit 180 may determine that a defect has occurred in the nozzle that discharged the k' droplet 310kb among the plurality of nozzles of the inkjet head unit 140.

Next, a method of determining whether there is a portion corresponding to the area spot in the image of the substrate G will be described.

When pixel printing is performed on the substrate G, the inkjet head unit 140 discharges droplets to the same position on the substrate G a plurality of times while reciprocating along the longitudinal direction 10 of the substrate G. And after that, the inkjet head unit 140 moves a predetermined distance in the width direction 20 of the substrate G, and then discharges the droplet a plurality of times at the same position on the substrate G while reciprocating the substrate G along the longitudinal direction 10 of the substrate G again. By repeating this process several times, the inkjet head unit 140 finally discharges droplets on the entire surface of the substrate G.

Figure 7:
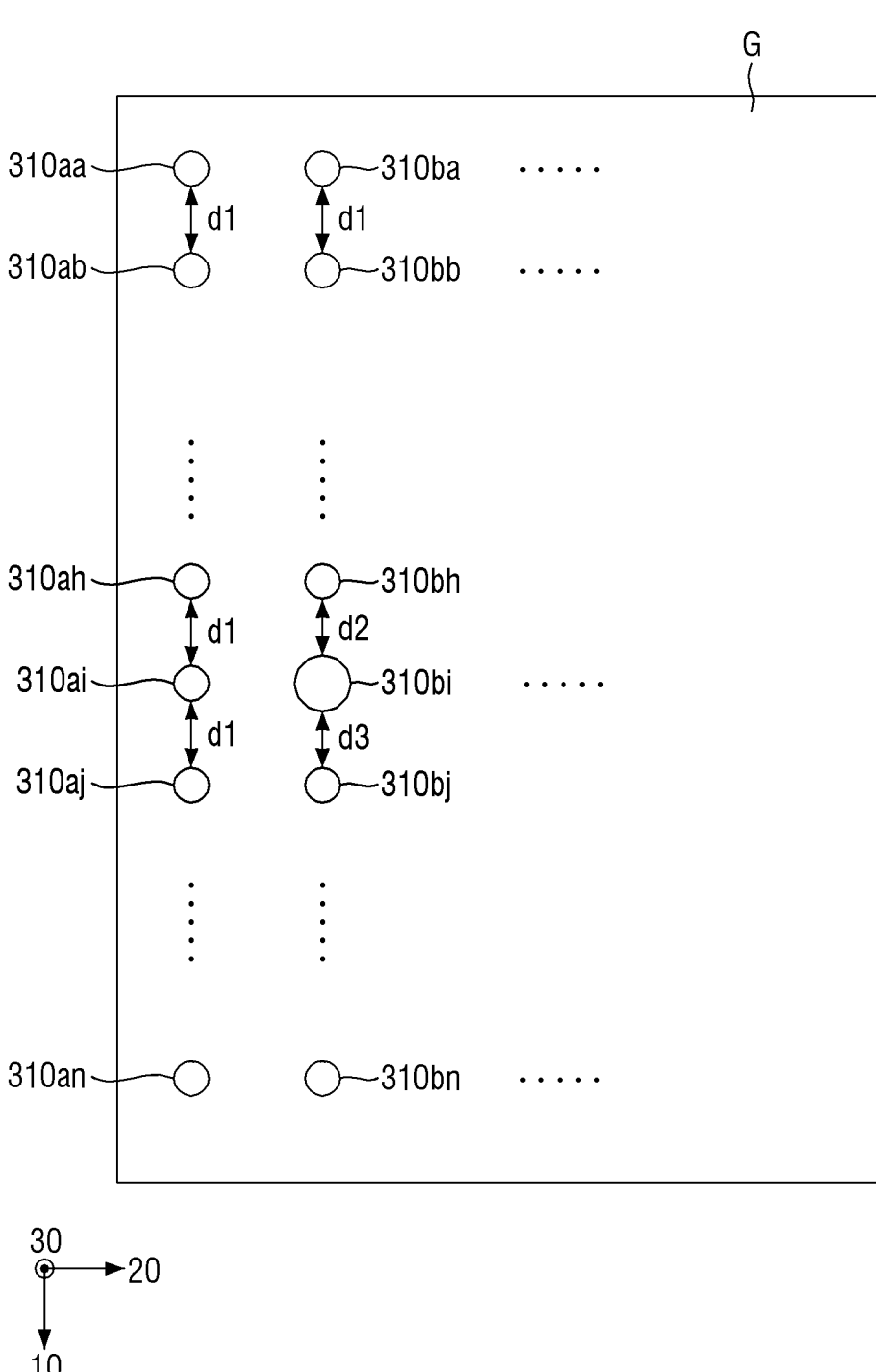
FIG. 7 is a first exemplary view for describing a method for determining an area spot of a substrate inspecting unit according to an embodiment of the present invention.

With respect to the substrate G processed as described above, as shown in FIG. 7, a plurality of droplets 310aa, 310ab, . . . , 310an formed in a first column along the longitudinal direction 10 of the substrate G A group are defined as a first group, and a plurality of droplets 310ba, 310bb, . . . , 310bn formed in a second column are defined as a second group. FIG. 7 is a first exemplary view for describing a method for determining an area spot of a substrate inspecting unit according to an embodiment of the present invention.

According to FIG. 7, the plurality of droplets 310aa, 310ab, . . . , 310an belonging to the first group maintain the same distance d1. Accordingly, in this case, the substrate inspecting unit 180 may determine that the plurality of droplets 310aa, 310ab, . . . , 310an belonging to the first group do not have an area spot.

On the other hand, the plurality of droplets 310ba, 310bb, . . . , 310bn belonging to the second group do not all maintain the same distance d1. Accordingly, in this case, the substrate inspecting unit 180 may determine that the plurality of droplets 310ba, 310bb, . . . , 310bn belonging to the second group have an area spot.

Meanwhile, in the above case, the distance d2 between the hth droplet 310bh and the ith droplet 310bi among the plurality of droplets 310ba, 310bb, . . . , 310bn belonging to the second group has a value smaller than the distance d1 between two different droplets belonging to the second group (d2<d1). In addition, the distance d3 between the ith droplet 310bi and the jth droplet 310bj among the plurality of droplets 310ba, 310bb, . . . , 310bn belonging to the second group also has a value smaller than the distance d1 between two different droplets belonging to the second group (d3<d1). In this case, the substrate inspecting unit 180 may determine that a defect has occurred in the nozzle that discharged the ith droplet 310bi among the plurality of nozzles of the inkjet head unit 140.

Figure 8:
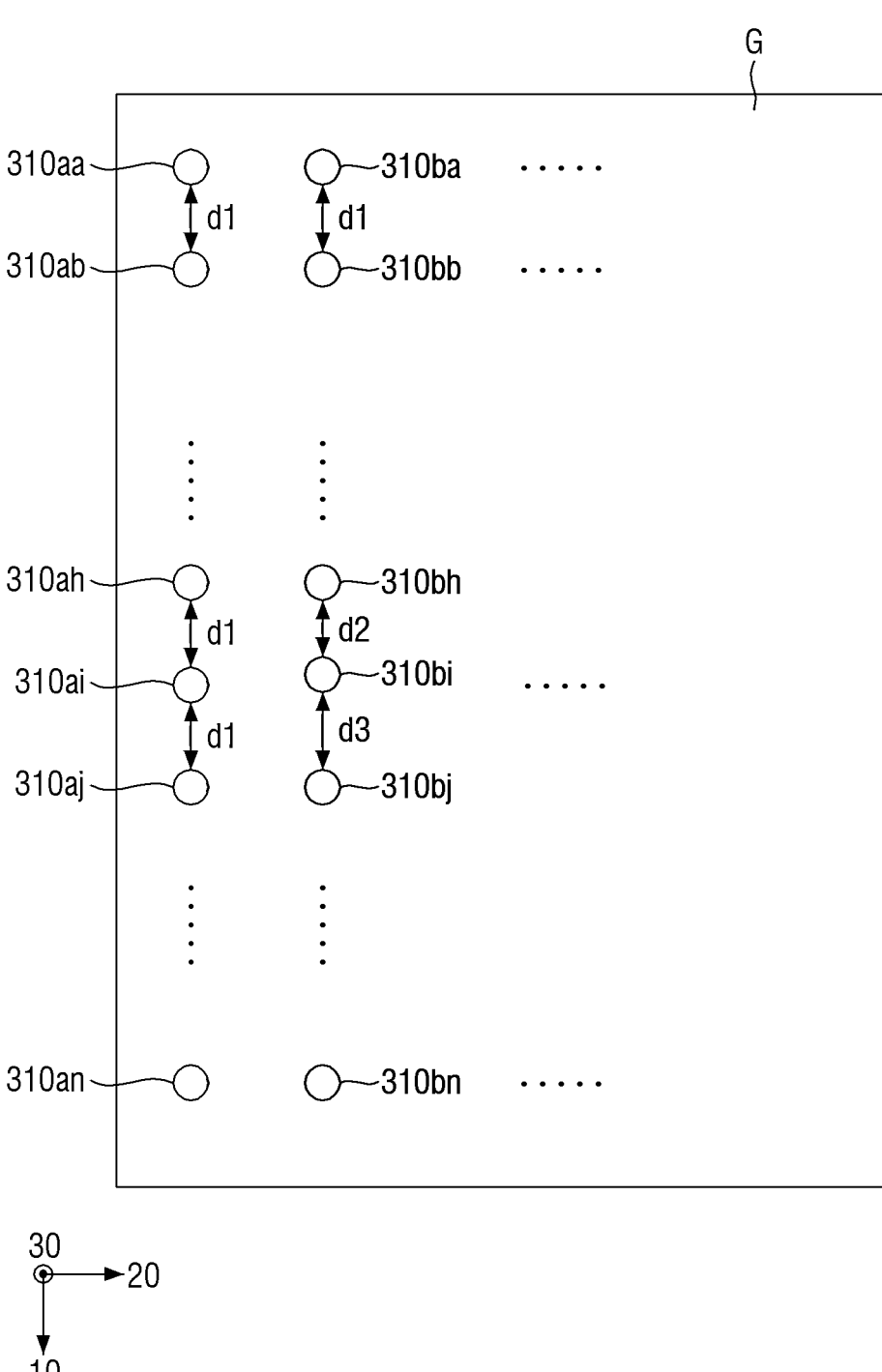
FIG. 8 is a second exemplary view for describing a method for determining an area spot of a substrate inspecting unit according to an embodiment of the present invention.

Meanwhile, as shown in FIG. 8, the distance d2 between the hth droplet 310bh and the ith droplet 310bi among the plurality of droplets 310ba, 310bb, . . . , 310bn belonging to the second group has a value smaller than the distance d1 between two different droplets belonging to the second group (d2<d1). On the other hand, the distance d3 between the ith droplet 310bi and the jth droplet 310bj among the plurality of droplets 310ba, 310bb, . . . , 310bn belonging to the second group has a value greater than the distance d1 between two different droplets belonging to the second group (d3>d1). Even in this case, the substrate inspecting unit 180 may determine that a defect has occurred in the nozzle that discharged the ith droplet 310bi among the plurality of nozzles of the inkjet head unit 140. FIG. 8 is a second exemplary view for describing a method for determining an area spot of a substrate inspecting unit according to an embodiment of the present invention.

Figure 9:
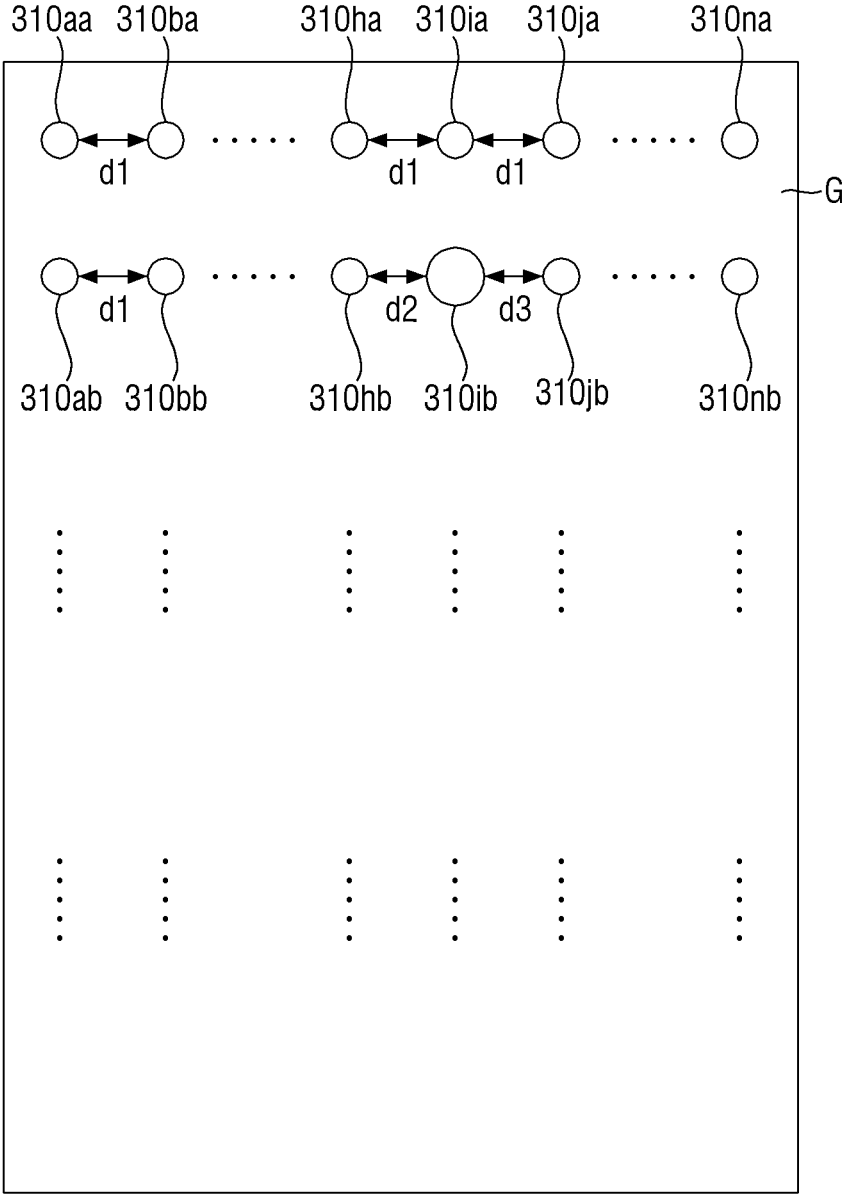
FIG. 9 is a third exemplary view for describing a method for determining an area spot of a substrate inspecting unit according to an embodiment of the present invention.
Figure 9:
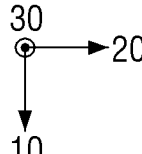

Similarly, as shown in FIG. 9, a plurality of droplets 310aa, 310ba, . . . , 310na formed in a first row along the width direction 20 of the substrate G are defined as a third group, and a plurality of droplets 310ab, 310bb, . . . , 310nb formed in a second row are defined as a fourth group. FIG. 9 is a third exemplary view for describing a method for determining an area spot of a substrate inspecting unit according to an embodiment of the present invention.

According to FIG. 9, the plurality of droplets 310aa, 310ba, . . . , 310na belonging to the third group maintain the same distance d1. Accordingly, in this case, the substrate inspecting unit 180 may determine that the plurality of droplets 310aa, 310ba, . . . , 310na belonging to the third group have no area spot.

On the other hand, the plurality of droplets 310ab, 310bb, . . . , 310nb belonging to the fourth group do not all maintain the same distance d1. Accordingly, in this case, the substrate inspecting unit 180 may determine that the plurality of droplets 310ab, 310bb, . . . , 310nb belonging to the fourth group have an area spot.

Meanwhile, in the above case, the distance d2 between the h'th droplet 310bh and the i'th droplet 310bi among the plurality of droplets 310ab, 310bb, . . . , 310nb belonging to the fourth group has a value smaller than the distance d1 between two different droplets belonging to the fourth group (d2<d1). Also, the distance d3 between the i'th droplet 310bi and the j'th droplet 310bj among the plurality of droplets 310ab, 310bb, . . . , 310nb belonging to the fourth group also has a value smaller than the distance d1 between two different droplets belonging to the second group (d3<d1). In this case, the substrate inspecting unit 180 may determine that a defect has occurred in the nozzle that discharged the i' droplet 310bi among the plurality of nozzles of the inkjet head unit 140.

Figure 10:
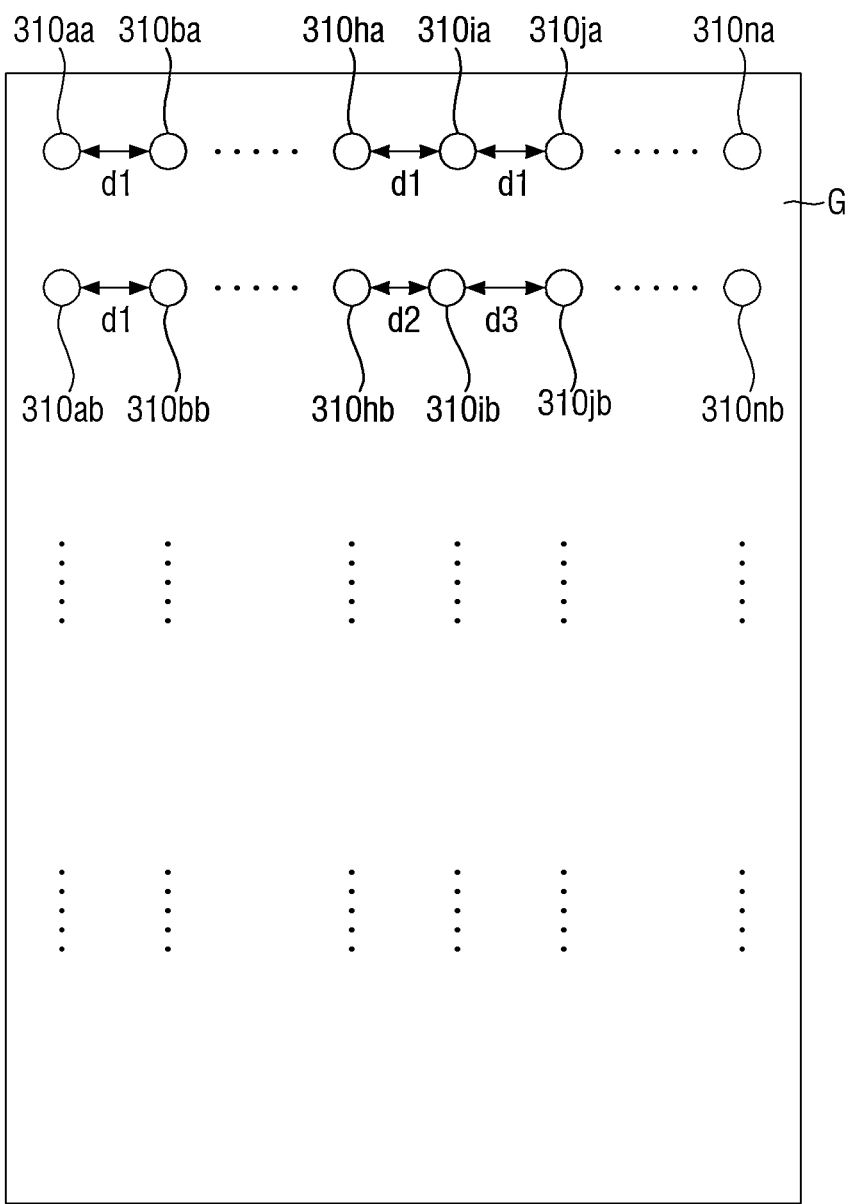
FIG. 10 is a fourth exemplary view for describing a method for determining an area spot of a substrate inspecting unit according to an embodiment of the present invention.
Figure 10:
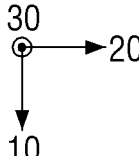

Meanwhile, as shown in FIG. 10, the distance d2 between the h'th droplet 310bh and the i'th droplet 310bi among the plurality of droplets 310ba, 310bb, . . . , 310bn belonging to the fourth group has a value smaller than the distance d1 between two different droplets belonging to the second group (d2<d1). On the other hand, the distance d3 between the i'th droplet 310bi and the j'th droplet 310bj among the plurality of droplets 310ba, 310bb, . . . , 310bn belonging to the second group has a value greater than the distance d1 between two different droplets belonging to the second group (d3>d1). Even in this case, the substrate inspecting unit 180 may determine that a defect has occurred in the nozzle which discharged the i' droplet 310bi among the plurality of nozzles of the inkjet head unit 140. FIG. 10 is a fourth exemplary view for describing a method for determining an area spot of a substrate inspecting unit according to an embodiment of the present invention.

Meanwhile, in the present invention, the plurality of droplets 310aa, 310ab, . . . , 310an belonging to the first group and the plurality of droplets 310aa, 310ba, . . . , 310na belonging to the third group may all maintain the same distance. That is, a distance between two different droplets among a plurality of droplets 310aa, 310ab, . . . , 310an belonging to the first group may be the same as the distance between two different droplets among a plurality of droplets 310aa, 310ba, . . . , 310na belonging to the third group.

However, the present embodiment is not limited thereto. The distance between the two different droplets of the plurality of droplets 310aa, 310ab, . . . , 310an belonging to the first group may be different from the distance between the two different droplets among the plurality of droplets 310aa, 310ba, . . . , 310na belonging to the third group.

Meanwhile, the substrate inspecting unit 180 may perform a line defect determining method and an area spot determining method based on the image obtained by the camera module 125, where the line defect determining method may be performed based on the image obtained using the line scan camera, and the area spot determining method may be performed based on an image obtained using an area scan camera.

On the other hand, the substrate inspecting unit 180 may determine the line defects and the area spots all at once by using the line defect determining method described above with reference to FIGS. 5 and 6 and the area spot determining method described with reference to FIGS. 7 to 10. Of course, the substrate inspecting unit 180 may also determine only one of a line defect and an area spot.

The present invention described above with reference to FIGS. 1 to 10 relates to an inkjet facility capable of monitoring impact error and spot. Specifically, the present invention can be applied to inkjet equipment that performs pixel printing, and can monitor impact error line defects and area spots. The present invention may include the following features for this purpose.

First, the gantry unit 130 for moving the inkjet head unit 140 may be equipped with a camera module 125 capable of scanning by each printing swath. The camera module 125 may be used to monitor impact error and spot.

Second, a scanned image for each swath is transferred to an image-dedicated PC (that is, the substrate inspecting unit 180) during the printing swath process, and the scanned image for each swath can be implemented as a grey level by the image-dedicated PC.

Third, it is possible to build a system that monitors the defect of the substrate G related to the line defect and the area spot and provides the defect fact as an alarm message.

Fourth, it is possible to operate a system that monitors line defects and area spot in real time according to the defect criteria.

Although the embodiments of the present invention have been described above with reference to the accompanying drawings, the present invention is not limited to the above embodiments, but may be manufactured in a variety of different forms, and those of ordinary skill in the art to which the present invention pertains can understood that the present invention may be embodied in other specific forms without changing the technical spirit or essential features of the present invention. Therefore, it should be understood that the embodiments described above are illustrative in all respects and not limiting.

What is claimed is:

1. An apparatus for processing a substrate comprising:
a process processing unit for supporting a substrate;
an inkjet head unit for discharging a droplet on the substrate while moving in a first direction and a second direction;
a gantry unit for moving the inkjet head unit; and
a substrate inspecting unit for inspecting the substrate in real time based on a plurality of droplets belonging to at least one row or column when the droplet is discharged onto the substrate and formed in the at least one row or column,
wherein the substrate inspecting unit inspects a first defect related to a line caused by the plurality of droplets and/or a second defect related to an area caused by the plurality of droplets,
wherein the substrate inspecting unit is configured to process an image related to the plurality of droplets based on a grey scale and inspect the first defect and/or the second defect based on the grey scaled image related to the plurality of droplets, and
wherein the substrate inspecting unit is configured to inspect the second defect related to an area caused by the plurality of droplets based on a distance between two different droplets aligned on a column.

2. The apparatus of claim 1, wherein the substrate inspecting unit inspects the first defect and/or the second defect based on an image obtained according to a swath operation of the inkjet head unit.

3. The apparatus of claim 2, wherein the substrate inspecting unit combines a plurality of partial images obtained according to a swath operation of the inkjet head unit, and then inspects the first defect and/or the second defect based on the combined image, or inspects the first defect and/or the second defect based on each partial image.

4. The apparatus of claim 1, wherein, when inspecting the first defect, the substrate inspecting unit inspects the first defect based on whether a plurality of droplets belonging to one row or column are located on the same line.

5. The apparatus of claim 1, wherein, when inspecting the second defect, the substrate inspecting unit inspects the second defect based on whether a plurality of droplets belonging to at least one row maintain the same distance, or inspects the second defect based on whether a plurality of droplets belonging to at least one column maintain the same distance.

6. The apparatus of claim 5, wherein a distance between two different droplets belonging to one row is different from a distance between two different droplets belonging to one column.

7. The apparatus of claim 1, wherein, when inspecting the second defect, the substrate inspecting unit inspects the second defect based on whether a plurality of droplets belonging to at least one row and at least one column maintain the same distance.

8. The apparatus of claim 7, wherein a distance between two different droplets belonging to one row is the same as a distance between two different droplets belonging to one column.

9. The apparatus of claim 1 further comprises,
a camera module for obtaining an image related to the plurality of droplets,
wherein the substrate inspecting unit inspects the first defect and/or the second defect based on an image obtained by a camera module.

10. The apparatus of claim 9, wherein the camera module is installed in the gantry unit.

11. The apparatus of claim 10, wherein the camera module is disposed behind the inkjet head unit or disposed in parallel with the inkjet head unit along a longitudinal direction of the gantry unit.

12. The apparatus of claim 9, wherein the camera module includes a line scan camera and an area scan camera.

13. The apparatus of claim 12, wherein the substrate inspecting unit inspects the first defect based on an image obtained using the line scan camera, and inspects the second defect based on an image obtained using the area scan camera.

14. An apparatus for processing a substrate comprising:
a process processing unit for supporting a substrate;
an inkjet head unit for discharging a droplet on the substrate while moving in a first direction and a second direction;
a gantry unit for moving the inkjet head unit; and
a substrate inspecting unit for inspecting the substrate in real time based on a plurality of droplets belonging to at least one row or column when the droplet is discharged onto the substrate and formed in the at least one row or column,
wherein the substrate inspecting unit inspects a first defect related to a line caused by the plurality of droplets and/or a second defect related to an area caused by the plurality of droplets based on an image related to the plurality of droplets and obtained according to a swath operation of the inkjet head unit,
wherein the substrate inspecting unit processes the image related to the plurality of droplets based on a grey scale, and then inspects the first defect and/or the second defect based on the grey scaled image,
wherein, when inspecting the first defect, the substrate inspecting unit inspects the first defect based on whether a plurality of droplets belonging to one row or column are located on the same line,
wherein, when inspecting the second defect, the substrate inspecting unit inspects the second defect based on whether a plurality of droplets belonging to at least one row and/or a plurality of droplets belonging to at least one column maintain the same distance, and
wherein the substrate inspecting unit is configured to inspect the second defect related to an area caused by the plurality of droplets based on a distance between two different droplets aligned on a column.

15. A unit for inspecting a substrate, wherein the substrate inspecting unit is provided in a substrate processing apparatus for processing the substrate by discharging a droplet on a substrate using an inkjet head unit, wherein, when the droplet is discharged onto the substrate and formed in at least one row or column, the substrate inspecting unit inspects the substrate in real time based on a plurality of droplets belonging to the at least one row or column, wherein the substrate inspecting unit inspects a first defect related to a line caused by the plurality of droplets and/or a second defect related to an area caused by the plurality of droplets based on an image related to the plurality of droplets, and wherein the substrate inspecting unit is configured to process an image related to the plurality of droplets based on a grey scale and inspect the first defect and/or the second defect based on the grey scaled image related to the plurality of droplets, and wherein the substrate inspecting unit is configured to inspect the second defect related to an area caused by the plurality of droplets based on a distance between two different droplets aligned on a column.

16. The unit of claim 15, wherein the substrate inspecting unit inspects the first defect and/or the second defect based on an image obtained according to a swath operation of the inkjet head unit.

17. The unit of claim 16, wherein the substrate inspecting unit combines a plurality of partial images obtained according to a swath operation of the inkjet head unit, and then inspects the first defect and/or the second defect based on the combined image, or inspects the first defect and/or the second defect based on each partial image.

* * * * *